(12) United States Patent
Aoai et al.

(10) Patent No.: US 8,475,996 B2
(45) Date of Patent: Jul. 2, 2013

(54) PHOTOSENSITIVE RESIN COMPOSITION

(75) Inventors: Natsumi Aoai, Tokyo (JP); Takaaki Kobayashi, Tokyo (JP)

(73) Assignee: Asahi Kasei E-Materials Corporation, Tokyo (JP)

( * ) Notice: Subject to any disclaimer, the term of this patent is extended or adjusted under 35 U.S.C. 154(b) by 295 days.

(21) Appl. No.: 12/678,974

(22) PCT Filed: Dec. 11, 2008

(86) PCT No.: PCT/JP2008/072537
§ 371 (c)(1),
(2), (4) Date: Mar. 18, 2010

(87) PCT Pub. No.: WO2009/078336
PCT Pub. Date: Jun. 25, 2009

(65) Prior Publication Data
US 2010/0209669 A1 Aug. 19, 2010

(30) Foreign Application Priority Data

Dec. 14, 2007 (JP) ................................. 2007-323311
Jul. 1, 2008 (JP) ................................. 2008-172451
Jul. 1, 2008 (JP) ................................. 2008-172463

(51) Int. Cl.
*G03F 7/00* (2006.01)
*G03F 7/004* (2006.01)
*G03F 7/027* (2006.01)
*G03F 7/028* (2006.01)
*C08G 77/04* (2006.01)

(52) U.S. Cl.
USPC ............... 430/270.1; 430/286.1; 430/913; 528/25; 528/26

(58) Field of Classification Search
USPC ............. 430/281.1, 286.1, 913; 528/25, 26
See application file for complete search history.

(56) References Cited

U.S. PATENT DOCUMENTS

| | | | | |
|---|---|---|---|---|
| 4,543,403 | A * | 9/1985 | Isayama et al. | 526/263 |
| 8,026,035 | B2 * | 9/2011 | Motallebi et al. | 430/270.1 |
| 8,048,611 | B2 * | 11/2011 | Kato et al. | 430/270.1 |
| 2005/0244658 | A1 * | 11/2005 | Bae et al. | 428/447 |
| 2007/0225466 | A1 * | 9/2007 | Matsumoto et al. | 528/25 |
| 2008/0014374 | A1 * | 1/2008 | Hirai | 428/1.1 |
| 2010/0019399 | A1 | 1/2010 | Kimura et al. | |
| 2010/0099044 | A1 * | 4/2010 | Hatakeyama et al. | 430/285.1 |
| 2010/0123259 | A1 * | 5/2010 | Yorisue | 257/791 |

FOREIGN PATENT DOCUMENTS

| | | |
|---|---|---|
| EP | 2133744 A1 | 12/2009 |
| JP | 10-176141 A | 6/1998 |
| JP | 2005-298800 A | 10/2005 |
| JP | 2007-291321 A | 11/2007 |
| JP | 2008-116598 A | 5/2008 |
| JP | 2008-203605 A | 9/2008 |
| JP | 2008-203613 A | 9/2008 |
| JP | 2008-203614 A | 9/2008 |
| JP | 2008-222892 A | 9/2008 |
| JP | 2008-225137 A | 9/2008 |
| JP | 2008-256884 A | 10/2008 |
| JP | 2009-20268 A | 1/2009 |
| WO | WO 2006/112234 A1 | 10/2006 |
| WO | WO 2008/041630 A1 | 4/2008 |
| WO | WO 2008/123210 A1 | 10/2008 |
| WO | WO 2008/123224 A1 | 10/2008 |
| WO | WO 2008123224 A1 * | 10/2008 |

* cited by examiner

*Primary Examiner* — Amanda C. Walke
(74) *Attorney, Agent, or Firm* — Birch, Stewart, Kolasch & Birch, LLP

(57) ABSTRACT

There is provided a photosensitive resin composition comprising:
(a) 100 parts by weight of a polyorganosiloxane obtained by a method of combining at least one silanol compound represented by the following formula (1):

$$R^1_2Si(OH)_2 \tag{1}$$

{the groups in the formula being defined in the claims}, at least one alkoxysilane compound represented by the following formula (2):

$$R^2_a R^3_b Si(OR^4)_{4-a-b} \tag{2}$$

{the groups in the formula being defined in the claims} and a catalyst, and polymerizing them without active addition of water;
(b) 1-50 parts by weight of a photopolymerization initiator;
(c) 40-600 parts by weight of a fluorene compound represented by the following formula (3):

$$\text{(3)} \quad H_2C=\underset{R^7}{\overset{O}{\underset{\|}{C}}}C(OR^5)_cO\text{—}\underbrace{\phantom{XXXXXXXX}}_{\text{fluorene core}}\text{—}O(R^6O)_d\underset{R^8}{\overset{O}{\underset{\|}{C}}}C=CH_2$$

{the groups in the formula being defined in the claims}; and
(d) 20-300 parts by weight of a compound other than component (c), having one or two (meth)acryloyl groups in the molecule.

12 Claims, No Drawings

PHOTOSENSITIVE RESIN COMPOSITION

TECHNICAL FIELD

The present invention relates to a photosensitive resin composition that is useful as an electrical component in semiconductor devices, microplastic lenses, liquid crystal polarizing plates, optical waveguides and the like that are intended primarily for optical applications, and to a resin insulating film to be used in electrical and electronic materials for semiconductor devices, multilayer circuit boards and the like. More specifically, the invention relates to a material for solid imaging devices such as microplastic lenses, CCDs or CMOS image sensors for optical communication and cellular phone camera modules, to a material for LED sealing compounds and photonic crystals for LED high luminance or for formation of a thin-film transistor array or antireflection film for the field of displays, to a material for polarizing plate optical elements for liquid crystal projectors, or to a material for forming LSI chip buffer coats or interlayer insulating films.

BACKGROUND ART

Plastic lenses are widely used in a variety of optical products because of their easier moldability and lower cost compared to glass. For example, thermoplastic plastics such as polymethyl methacrylate and polystyrene and thermosetting plastics such as polydiethyleneglycol bisallyl carbonate are used. In recent years, UV curable resins are increasingly being used as optical materials, and such UV curable resins when used as lenses must exhibit not only the properties commonly demanded for optical materials, such as viscosity, fast-curing properties, heat resistance, low shrinkage factor and transparency, but also a high refractive index. A high refractive index for plastic lenses is necessary to achieve smaller thicknesses and lighter weights for lenses, but employing inner microlenses with high refractive indexes in CCD and CMOS image sensors can also prevent the reduced condensing, or loss of sensitivity, per pixel that occurs with increased micronization. When a plastic lens is used in the camera module of a cellular phone, the design incorporates a combination of lenses, with the first lens of the lenses used therein having a high refractive index and a high Abbe number and the second lens having a high refractive index and a low Abbe number, as an achromatic correction lens.

Many types of materials with high refractive indexes exist, but it has been extremely difficult to exhibit a high refractive index while maintaining the basic properties required for optical materials, such as high transparency and heat resistance. Patent document 1 and Patent document 2, for example, are prior art documents relating to high refraction materials used as optical materials, but both technologies provide insufficient mechanical properties.

Patent document 3 discloses a photosensitive polyorganosiloxane composition as a coating material with good storage stability, curable by ultraviolet rays, having high transparency and able to form film thicknesses of 1-150 μm. The cured product disclosed in Patent document 3 has excellent properties as an optical material, including heat resistance at 300° C. and above, and high transparency. Also, Patent document 4 discloses an inorganic/organic hybrid oligomer with excellent optical characteristics, heat resistance, transparency, insulating property and wear resistance. However, it has been difficult to simultaneously obtain a high refractive index and sufficient mechanical properties for lens materials, with only the technologies disclosed in Patent document 3 and 4. The compound with a phenyl sulfide structure disclosed in Patent document 5 maintains a high refractive index, but fails to maintain sufficient heat resistance as a lens material, and therefore yellowing deterioration occurs during the step of reflow mounting, and transparency cannot be maintained. Thus, no prior art document exists that discloses an optical material having high transparency, a high refractive index, heat resistance and crack resistance that are required for use as a permanent material such as lens.

Patent document 6, incidentally, discloses a polymerizable composition comprising a polyfunctional (meth)acrylate, but the disclosed polysilane has a different structure from the (a) polyorganosiloxane according to the invention.

[Patent document 1] Japanese Unexamined Patent Publication SHO No. 63-309509
[Patent document 2] Japanese Unexamined Patent Publication HEI No. 04-045401
[Patent document 3] European Patent Publication No. 1196478
[Patent document 4] Japanese Unexamined Patent Publication No. 2005-298800
[Patent document 5] Japanese Unexamined Patent Publication No. 2004-35857
[Patent document 6] International Patent Publication WO2005/033061

DISCLOSURE OF THE INVENTION

Problems to be Solved by the Invention

It is an object of the invention to provide a photosensitive resin composition having a high refractive index as well as excellent crack resistance useful for production of integral products such as solid imaging devices and electronic parts which require a solder reflow step.

The present inventors have conducted much research on siloxane-containing photosensitive resins with the aim of achieving the object stated above, and have found that a photosensitive resin composition with both a high refractive index and crack resistance can be obtained by adding a photopolymerization initiator to a polyorganosiloxane obtained by mixing at least two different specific silane compounds and polymerizing them using a specific catalyst, and further using a fluorene-containing compound with a specific structure and a compound other than that component with 1 or 2 (meth)acryloyl groups in the molecule, the invention having been completed on the basis of this finding.

Means for Solving the Problems

Specifically, the present invention provides the following [1] to [19].

[1]. A photosensitive resin composition comprising the following components (a) to (d):
(a) 100 parts by weight of a polyorganosiloxane obtained by a method of combining at least one silanol compound represented by the following formula (1):

[Chemical Formula 1]

$$R^1{}_2Si(OH)_2 \qquad (1)$$

{wherein the multiple $R^1$ groups each independently represent a C6-18 organic group containing at least one aromatic group},
at least one alkoxysilane compound represented by the following formula (2):

[Chemical Formula 2]

$$R^2{}_aR^3{}_bSi(OR^4)_{4-a-b} \qquad (2)$$

{wherein $R^2$ is a C2-17 organic group containing at least one group selected from the group consisting of epoxy and carbon-carbon double bond groups, when multiple $R^2$ groups are present they may be the same or different, $R^3$ and $R^4$ each independently represent methyl or ethyl, a is an integer of 1 or 2, b is an integer of 0 or 1, and a+b is no greater than 2} and a catalyst, and polymerizing them without active addition of water;
(b) 1-50 parts by weight of a photopolymerization initiator;
(c) 40-600 parts by weight of a fluorene compound represented by the following formula (3):

[Chemical Formula 3]

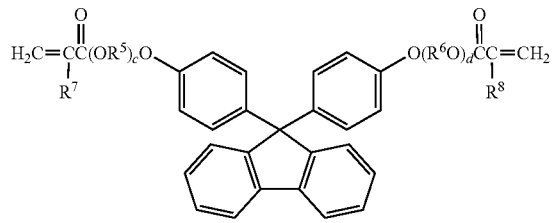

(3)

{wherein $R^5$ and $R^6$ each independently represent a C2-4 alkylene group, $R^7$ and $R^8$ each independently represent hydrogen or methyl, c and d are integers with c+d=0-24, and they may be the same or different, and the fluorene skeleton is optionally substituted with C1-28}; and
(d) 20-300 parts by weight of a compound other than component (c), having one or two (meth)acryloyl groups in the molecule.

[2] A photosensitive resin composition according to [1] above, wherein the (a) polyorganosiloxane is polymerized using diphenylsilanediol as the silanol compound represented by formula (1), and using a compound wherein a is 1 and b is 0 as the alkoxysilane compound represented by formula (2).

[3] A photosensitive resin composition according to [1] or [2] above, wherein the (a) polyorganosiloxane is polymerized using at least one catalyst from among metal alkoxides represented by the following formula (4):

[Chemical Formula 4]

$$M^1(OR^9)_4 \quad (4)$$

{wherein $M^1$ is silicon, germanium, titanium or zirconium, and multiple $R^9$ groups are each independently C1-4 alkyl groups},
and metal alkoxides represented by the following formula (5):

[Chemical Formula 5]

$$M^2(OR^{10})_3 \quad (5)$$

{wherein $M^2$ is boron or aluminum, and multiple $R^{10}$ groups are each independently C1-4 alkyl groups}.

[4] A photosensitive resin composition according to any one of [1] to [3] above, wherein the (a) polyorganosiloxane is polymerized using a diphenylsilanediol as the silanol compound represented by formula (1) above, and using at least one compound selected from the group consisting of 3-methacryloxypropyltrimethoxysilane, 3-acryloxypropyltrimethoxysilane, vinylmethyltrimethoxysilane, vinylethyltrimethoxysilane, p-styryltrimethoxysilane and p-styryltriethoxysilane as the alkoxysilane compound represented by formula (2) above.

[5] A photosensitive resin composition according to any one of [1] to [4] above, wherein the (c) component is a fluorene compound represented by the following formula (6):

[Chemical Formula 6]

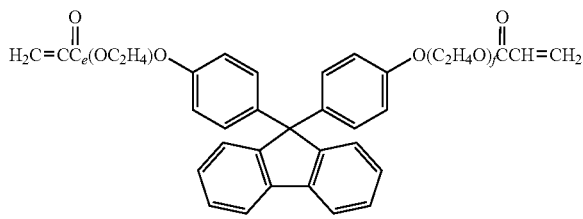

(6)

{wherein e and f each independently represent 1 or 2}.

[6] A photosensitive resin composition according to any one of [1] to [5], which comprises an aromatic group-containing (meth)acrylate compound as the (d) component.

[7] A photosensitive resin composition according to any one of [1] to [5], wherein the (d) component is at least one compound selected from the group consisting of phenoxyethyl acrylate, paraphenylphenoxyethyl acrylate and paraphenylphenyl acrylate.

[8] A photosensitive resin composition according to any one of [1] to [7] above, wherein the (b) photopolymerization initiator includes at least one compound selected from the group consisting of the compound represented by the following formula (7):

[Chemical Formula 7]

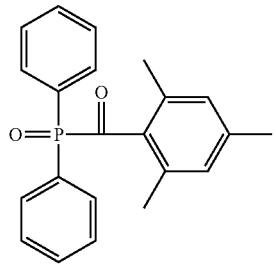

(7)

and the compound represented by the following formula (8):

[Chemical Formula 8]

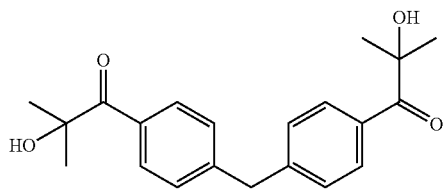

(8)

[9] A photosensitive resin composition according to any one of [1] to [8] above, which further comprises (e) 6-250 parts by weight of a compound having 3 or more (meth)acryloyl groups in the molecule.

[10] A photosensitive resin composition according to any one of [1] to [9] above, which further comprises (f) 0.2-50 parts by weight of one or more compounds selected from the group consisting of ultraviolet absorbers and hindered amine-containing light stabilizers.

[11] A photosensitive resin composition according to any one of [1] to [10] above, which further comprises (g) 1-100 parts by weight of a silane coupling agent.

[12] A cured product obtainable by photocuring a photosensitive resin composition according to any one of [1] to [11] above.

[13] A method for producing a molded article, which comprises a step of filling a molding die with a photosensitive resin composition according to any one of [1] to [11] above, a step of pressing the opening of the molding die against a board, a step of light exposure, a step of releasing the die and a step of heating the entire base material.

[14] A method for producing a molded article according to [13] above, which includes a step of coating the board with a silane coupling agent before the step of pressing the opening of the die against the board, and wherein during the step of pressing the opening of the die against the board, the opening of the die is pressed against the silane coupling agent-coated side of the board.

[15] A method for producing a molded article according to [13] or [14] above, which comprises, before the step of light exposure, a step of heating the entire board at 50-150° C. for between 1 minute and 30 minutes while the opening of the die is pressed against the board.

[16] A molded article obtainable by the method according to any one of [13] to [15].

[17] A method of forming a cured relief pattern, which comprises a step of coating a base material with a photosensitive resin composition according to any one of [1] to [11] to obtain a coated film, a step of irradiating the coated film with active light rays for photocuring of the exposed sections, a step of using a developing solution to remove the uncured sections of the film, and a step of heating the entire base material.

[18] A cured relief pattern that can be obtained by the method according to [17] above.

[19] A semiconductor device comprising a cured relief pattern according to [18] above.

Effect of the Invention

The photosensitive resin composition of the invention has a high refractive index as well as excellent crack resistance useful for production of integral products such as solid imaging devices and electronic parts which require a solder reflow step. In addition, if the photosensitive resin composition of the invention contains a specific photopolymerization initiator, a photosensitive resin composition with high transparency in addition to the aforementioned properties is obtained.

BEST MODE FOR CARRYING OUT THE INVENTION

Each of the components in the photosensitive resin composition of the invention will now be explained in detail.
<Photosensitive Resin Composition>
(a) Polyorganosiloxane The polyorganosiloxane used in the photosensitive resin composition of the invention is obtained by a method of combining at least one type of silanol compound represented by the following formula (1):

[Chemical Formula 9]

{wherein multiple $R^1$ groups each independently represent a C6-18 organic group containing at least one aromatic group}, at least one type of alkoxysilane compound represented by the following formula (2):

[Chemical Formula 10]

{wherein $R^2$ represents a C2-17 organic group containing at least one group selected from the group consisting of epoxy and carbon-carbon double bond groups, when multiple $R^2$ groups are present they may be the same or different, $R^3$ and $R^4$ each independently represent methyl or ethyl, a is an integer of 1 or 2, b is an integer of 0 or 1, and a+b is no greater than 2}, and a catalyst, and polymerizing them without active addition of water.

In the silanol compound represented by formula (1) above (hereinafter also referred to simply as "silanol compound"), $R^1$ is a C6-18 organic group containing at least one aromatic group, and specifically it is preferably at least one group selected from among groups represented by the following structure:

[Chemical Formula 11]

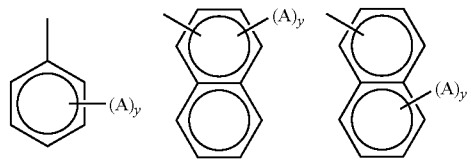

{wherein A is one type of group selected from the group consisting of C1-4 alkyl, —CH═CH$_2$, —CH═CH—CH$_3$ and —CH$_2$—CH═CH$_2$, y is an integer of 0, 1 or 2, and when multiple A glycidoxypropyltriethoxysilane, vinylmethyltrimethoxysilane, vinylethyltrimethoxysilane, vinylmethyltriethoxysilane, vinylethyltriethoxysilane, 1-propenyltrimethoxysilane, 1-propenyltriethoxysilane, 2-propenyltrimethoxysilane, 2-propenyltriethoxysilane, 3-methacryloxypropyltrimethoxysilane, 3-methacryloxypropyltriethoxysilane, 3-acryloxypropyltrimethoxysilane, 3-acryloxypropyltriethoxysilane, p-styryltrimethoxysilane, p-styryltriethoxysilane, p-(1-propenylphenyl)trimethoxysilane, p-(1-propenylphenyl)triethoxysilane, p-(2-propenylphenyl)trimethoxysilane, p-(2-propenylphenyl)triethoxysilane, 3-glycidoxypropylmethyldiethoxysilane, 3-methacryloxypropylmethyldimethoxysilane, 3-methacryloxypropylmethyldiethoxysilane, p-styrylmethyldimethoxysilane and p-styrylmethyldiethoxysilane.

Of these, compounds wherein a is 1 and b is 0 are preferred as the alkoxysilane compound represented by formula (2).

In order to obtain excellent UV-i photosensitive properties, photopolymerizable compounds with carbon-carbon double bonds such as 3-methacryloxypropyltrimethoxysilane, 3-methacryloxypropyltriethoxysilane, 3-acryloxypropyltrimethoxysilane, 3-acryloxypropyltriethoxysilane, vinylmethyltrimethoxysilane, vinylethyltrimethoxysilane, p-styryltrimethoxysilane and p-styryltriethoxysilane are more preferred, 3-methacryloxypropyltrimethoxysilane, 3-acryloxypropyltrimethoxysilane, vinylmethyltrimethoxysilane, vinylethyltrimethoxysilane, p-styryltrimethoxysilane and p-styryltriethoxysilane are even more preferred, and from the viewpoint of improved groups are present they may be the same or different}.

As preferred silanol compounds there may be mentioned diphenylsilanediol, di-p-toluoylsilanediol, di-p-styrylsilanediol and dinaphthylsilanediol, but diphenylsilanediol (hereinafter also referred to as "DPD") is particularly preferred from the viewpoint of copolymerization and heat resistance.

In the alkoxysilane compound represented by formula (2) above (hereinafter also referred to simply as "alkoxysilane compound"), $R^2$ is a C2-17 organic group containing at least one group selected from the group consisting of epoxy and carbon-carbon double bond groups. Preferred examples of $R^2$ are selected from among groups represented by the following structure:

[Chemical Formula 12]

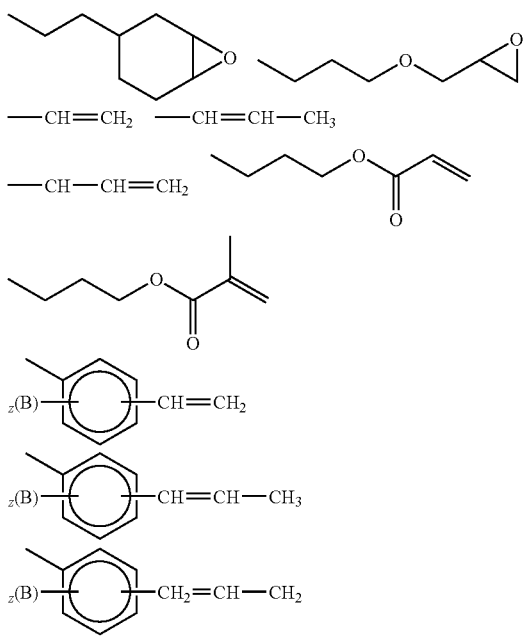

{wherein B is a C1-4 alkyl group, z is an integer of 0, 1 or 2, and when multiple A groups are present they may be the same or different}.

As preferred alkoxysilane compounds there may be mentioned 2-(3,4-epoxycyclohexyl)ethyltrimethoxysilane, 2-(3,4-epoxycyclohexyl)ethyltriethoxysilane, 3-glycidoxypropyltrimethoxysilane, 3-refractive index, p-styryltrimethoxysilane is especially preferred.

The catalyst used may be a compound that promotes dealcoholization condensation reaction between the silanol group of the silanol compound and the alkoxysilyl group of the alkoxysilane compound.

As preferred catalysts there may be mentioned at least one catalyst from among metal alkoxides represented by the following formula (4):

[Chemical Formula 13]

$$M^1(OR^9)_4 \quad (4)$$

{wherein $M^1$ is silicon, germanium, titanium or zirconium, and the multiple $R^9$ groups are each independently C1-4 alkyl groups},
and metal alkoxides represented by the following formula (5)

[Chemical Formula 14]

$$M^2(OR^{10})_3 \quad (5)$$

{wherein $M^2$ is boron or aluminum and the multiple $R^{10}$ groups are each independently C1-4 alkyl groups} (these will also be referred to hereunder as "metal alkoxide"), or at least one compound selected from the group consisting of alkali metal hydroxides and alkaline earth metal hydroxides.

Preferred among these are one or more metal alkoxides selected from the group consisting of formula (4) and formula (5) above. A metal alkoxide represented by formula (4) or formula (5) catalyzes dealcoholization condensation reaction between the silanol compound (silanol group) and alkoxysilane compound (alkoxysilyl group), while itself contributing to dealcoholization condensation reaction by behaving as an alkoxy group-containing compound, to form a polysiloxane or polysilsesquioxane structure incorporated into the molecule.

The mixing ratio is basically a molar ratio of 1:1 for the silanol compound and alkoxysilane compound, but the alkoxysilane compound may be mixed in a proportion of 30-70 mol with respect to 50 mol of the silanol compound. It is preferred to adjust the overall mixing ratio by exchanging a portion of the alkoxysilane compound (the alkoxysilane compound mixing content will be lowered in a fixed proportion) when the metal alkoxide is mixed therewith.

Specifically, when the tetravalent metal alkoxide represented by formula (4) above is used as the metal alkoxide, the tetravalent metal alkoxide and alkoxysilane compound are preferably exchanged in a molar ratio of 1:2 (the alkoxysilane compound reduces by 2 mol for each 1 mol increase in the tetravalent metal alkoxide mixing content). When a trivalent metal alkoxide represented by formula (5) above is used, the trivalent metal alkoxide and alkoxysilane compound are preferably exchanged in a molar ratio of 2:3.

The amount of catalyst added with respect to the total mol % of the silanol compound and alkoxysilane compound is preferably 0.05-10 mol % and more preferably 0.1-3 mol %.

As preferred trivalent or tetravalent metal alkoxides there may be mentioned trimethoxyaluminum, triethoxyaluminum, tri-n-propoxyaluminum, tri-iso-propoxyaluminum, tri-n-butoxyaluminum, tri-iso-butoxyaluminum, tri-sec-butoxyaluminum, tri-tert-butoxyaluminum, trimethoxyboron, triethoxyboron, tri-n-propoxyboron, tri-iso-propoxyboron, tri-n-butoxyboron, tri-iso-butoxyboron, tri-sec-butoxyboron, tri-tert-butoxyboron tetramethoxysilane, tetraethoxysilane, tetra-n-propoxysilane, tetra-iso-propoxysilane, tetra-n-butoxysilane, tetra-iso-butoxysilane, tetra-sec-butoxysilane, tetra-tert-butoxysilane, tetramethoxygermanium, tetraethoxygermanium, tetra-n-propoxygermanium, tetra-iso-propoxygermanium, tetra-n-butoxygermanium, tetra-iso-butoxygermanium, tetra-sec-butoxygermanium, tetra-tert-butoxygermanium, tetramethoxytitanium, tetraethoxytitanium, tetra-n-propoxytitanium, tetra-iso-propoxytitanium, tetra-n-butoxytitanium, tetra-iso-butoxytitanium, tetra-sec-butoxytitanium, tetra-tert-butoxytitanium, tetramethoxyzirconium, tetraethoxyzirconium, tetra-n-propoxyzirconium, tetra-iso-propoxyzirconium, tetra-n-butoxyzirconium, tetra-iso-butoxyzirconium, tetra-sec-butoxyzirconium and tetra-tert-butoxyzirconium.

From the viewpoint of transparency of the obtained liquid resin and conducting a rapid and uniform polymerization reaction, the catalyst is preferably a liquid in the reaction temperature range, and in consideration of catalyst activity and availability, the catalyst is preferably tetra-iso-propoxytitanium or tetra-tert-butoxytitanium.

As preferred alkali metal hydroxides there may be mentioned lithium hydroxide, sodium hydroxide and potassium hydroxide. As preferred alkaline earth metal hydroxides there may be mentioned alkaline earth metal hydroxides such as calcium hydroxide, strontium hydroxide and barium hydroxide, and their hydrates.

A polyorganosiloxane can be polymerized by appropriately mixing the preferred silanol compounds, alkoxysilane compounds and catalysts with heating. The heating temperature is an important parameter for controlling the polymerization degree of the polyorganosiloxane to be produced. The starting mixture is preferably heated and polymerized at 70° C.-150° C., although this will depend on the target polymerization degree.

When p-styryltrimethoxysilane, preferred for improving the refractive index, is used as the alkoxysilane compound, the amount of catalyst added during polymerization is preferably between 0.05 mol % and 1 mol % and more preferably between 0.1 mol % and 0.5 mol %, from the viewpoint of obtaining a polyorganosiloxane with higher transparency.

The upper limit for the amount of metal alkoxide added for polymerization will depend on the desired polyorganosiloxane performance. Calculated from the minimum required amount, the upper limit for the amount of metal alkoxide added for polymerization is preferably no greater than 40 mol % and more preferably no greater than 30 mol % with respect to the total mol % of the preferred silanol compound that is used.

The reaction conditions for polymerization are preferably 40° C.-150° C. for 0.1-10 hours.

A product obtained by a step of hydrolysis of a silanol compound and alkoxysilane compound at a temperature of 75-85° C. for 30 minutes to 1 hour without active addition of water is available as "ORMOCER" ONE® by Fraunhofer ISC, Germany.

(b) Photopolymerization Initiator

A photopolymerization initiator is added to the photosensitive resin composition of the invention to impart photosensitivity. As preferred photopolymerization initiators there may be mentioned the following compounds with absorption at 365 nm.

(1) Benzophenone derivatives: For example, benzophenone, 4,4'-bis(diethylamino)benzophenone, methyl o-benzoylbenzoate, 4-benzoyl-4'-methyldiphenylketone, dibenzylketone and fluorenone;

(2) Acetophenone derivatives: For example, 2,2'-diethoxyacetophenone, 2-hydroxy-2-methylpropiophenone, 2,2-dimethoxy-1,2-diphenylethan-1-one, 1-hydroxycyclohexylphenylketone, 2-methyl-1-[4-(methylthio)phenyl]-2-morpholinopropan-1-one, 2-hydroxy-1-{4-[4-(2-hydroxy-2-methylpropionyl)-benzyl]-phenyl}-2-methylpropan-1-one, phenylmethyl glyoxylate and (2-hydroxy-1-{4-[4-(2-hydroxy-2-methyl-propionyl)-benzyl]-phenyl}-2-methyl-propan-1-one) (IRGACURE127 photoinitiator by Ciba, Japan);

(3) Thioxanthone derivatives: For example, thioxanthone, 2-methylthioxanthone, 2-isopropylthioxanthone and diethylthioxanthone;

(4) Benzyl derivatives: For example, benzyl, benzyldimethylketal and benzyl-β-methoxyethylacetal;

(5) Benzoin derivatives: For example, benzoin, benzoinmethyl ether and 2-hydroxy-2-methyl-1-phenylpropan-1-one;

(6) Oxime-based compounds: For example, 1-phenyl-1,2-butanedione-2-(O-methoxycarbonyl)oxime, 1-phenyl-1,2-propanedione-2-(O-methoxycarbonyl)oxime, 1-phenyl-1,2-propanedione-2-(O-ethoxycarbonyl)oxime, 1-phenyl-1,2-propanedione-2-(O-benzoyl)oxime, 1,3-diphenylpropanetrione-2-(O-ethoxycarbonyl)oxime, 1-phenyl-3-ethoxypropanetrione-2-(O-benzoyl)oxime, 1,2-octanedione, 1-[4-(phenylthio)-2-(O-benzoyloxime)] (OXE-01 photoinitiator by Ciba, Japan), ethanone, 1-[9-ethyl-6-(2-methylbenzoyl)-9H-carbazol-3-yl]- and 1-(O-acetyloxime) (IRGACURE OXE02 photoinitiator by Ciba, Japan);

(7) α-Hydroxyketone-based compounds: For example, 2-hydroxy-2-methyl-1-phenylpropan-1-one, 1-[4-(2-hydroxyethoxy)phenyl]-2-hydroxy-2-methyl-1-propan-1-one and 2-hydroxy-1-{4-[4-(2-hydroxy-2-methylpropionyl)-benzyl] phenyl}-2-methylpropane;

(8) α-Aminoalkylphenone-based compounds: For example, 2-benzyl-2-dimethylamino-1-(4-morpholinophenyl)-butanone-1 (IRGACURE369 photoinitiator by Ciba, Japan) and 2-dimethylamino-2-(4-methylbenzyl)-1-(4-morpholin-4-yl-phenyl)butan-1-one;

(9) Phosphine oxide-based compounds: For example, bis(2, 4,6-trimethylbenzoyl)-phenylphosphine oxide, bis(2,6-dimethoxybenzoyl)-2,4,4-trimethyl-pentylphosphine oxide and 2,4,6-trimethylbenzoyl-diphenyl-phosphine oxide (DAROCUR TPO$^R$ photoinitiator by Ciba, Japan);

(10) Titanocene compounds: For example, bis($\eta^5$-2,4-cyclopentadien-1-yl)-bis(2,6-difluoro-3-(1H-pyrrol-1-yl)phenyl) titanium;

(11) Benzoate derivatives: For example, ethyl-p-(N,N-dimethylaminobenzoate); and

(12) Acridine derivatives: For example, 9-phenylacridine.

These photopolymerization initiators may be used alone or in mixtures of two or more.

Of the photopolymerization initiators mentioned above there are preferred (2) acetophenone derivatives, (8) α-aminoalkylphenone-based compounds and (9) phosphine oxide-based compounds because of their high sensitivity. From the viewpoint of high transparency and high sensitivity of molded articles there are preferred (9) phosphine oxide-based compounds, and particularly 2,4,6-trimethylbenzoyl-diphenyl-phosphine oxide (DAROCUR TPO$^R$ photoinitiator by Ciba, Japan, hereunder also referred to as "DAROCUR TPO$^R$ photoinitiator", and compounds represented by the following formula (7)):

[Chemical Formula 15]

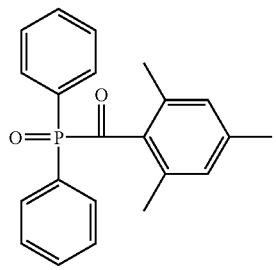

(7)

or (2) acetophenone derivatives, and particularly 2-hydroxy-1-{4-[4-(2-hydroxy-2-methyl-propionyl)-benzyl]-phenyl}-2-methyl-propan-1-one (IRGACURE127$^R$ photoinitiator by Ciba, Japan, hereunder also referred to as "IRGACURE127 photoinitiator", compound represented by the following formula (8)):

[Chemical Formula 16]

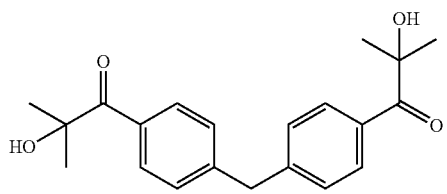

(8)

while preferably both DAROCUR TPO$^R$ photoinitiator and IRGACURE127 photoinitiator are used.

The amount of (b) photopolymerization initiator added is preferably 1-50 parts by weight and more preferably 2-30 parts by weight with respect to 100 parts by weight of the (a) polyorganosiloxane. If the amount is at least 1 part by weight, radicals will be supplied only in the amount sufficient for photoradical polymerization during light exposure, such that curing of the exposed sections will proceed sufficiently to allow a practical cured molded article to be obtained. If the amount of photopolymerization initiator addition is no greater than 50 parts by weight, there will be no over-absorption of exposure light near the coating film surface so that the exposure light rays will reach near to the board surface, resulting in uniform photoradical polymerization in the film thickness direction and a practical cured molded article will be obtainable.

(c) Fluorene Compound

A fluorene compound represented by the following formula (3) is used in the photosensitive resin composition of the invention.

[Chemical Formula 17]

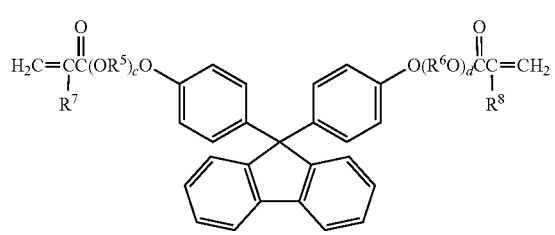

(3)

{In the formula, $R^5$ and $R^6$ are each independently a C2-4 alkylene group, $R^7$ and $R^8$ are each independently hydrogen or a methyl group, c and d are integers such that c+d=0-24, and they may be the same or different, and the fluorene skeleton is optionally substituted with a C1-28 group.}

It is preferably a fluorene compound represented by the following formula (6).

[Chemical Formula 18]

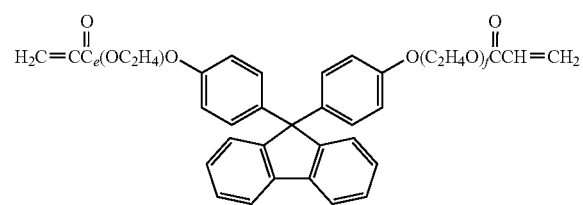

(6)

{In the formula, e and f are each independently 1 or 2.}

Especially preferred is 9,9-bis[4-(2-acryloyloxyethoxy)phenyl]fluorene (hereunder also referred to as "A-BPEF").

The amount of (c) fluorene compound added is preferably 40-600 parts by weight and more preferably 75-300 parts by weight with respect to 100 parts by weight of the (a) polyorganosiloxane. An amount of at least 40 parts by weight will allow a relief pattern with a high refractive index to be obtained by curing. From the viewpoint of heat resistance and temperature shock resistance, the amount of fluorene compound added is preferably no greater than 600 parts by weight.

(d) Compound Other than Component (c), Having One or Two (Meth)acryloyl Groups in the Molecule There is preferably added to the photosensitive resin composition of the invention (d) a compound other than component (c), having 1 or 2 (meth)acryloyl groups in the molecule, as suitable for the purpose, in order to provide a photosensitive resin composition having excellent properties including increased refractive index, improved curability, enhanced adhesiveness, improved softness for cured molded articles, and improved handleability due to lower viscosity of the photosensitive resin composition. These compounds may be used alone or in mixtures of two or more. Throughout the present specification, the term "(meth)acryloyl" refers to acryloyl and/or methacryloyl.

The photosensitive resin composition preferably includes an aromatic group-containing (meth)acrylate compound as component (d), from the viewpoint of maintaining a high refractive index, improving the curability, enhancing the adhesiveness and improving the softness of cured molded articles. An aromatic group-containing (meth)acrylate compound is a (meth)acrylate compound containing an aromatic group and no silicon in the structure. As examples there may be mentioned phenoxyethyl acrylate (hereunder also referred to as "PEA"), paraphenylphenoxyethyl acrylate (ARONIX TO-1463 by ToaGosei Co., Ltd.), paraphenylphenyl acrylate (ARONIX TO-2344 by ToaGosei Co., Ltd.), phenyl glycidyl ether acrylate (hereunder referred to as "PGEA"), benzyl (meth)acrylate, phenoxydiethyleneglycol(meth)acrylate, phenol(meth)acrylate modified with 3-15 mol ethylene oxide, cresol(meth)acrylate modified with 1-15 mol ethylene oxide, nonylphenol(meth)acrylate modified with 1-20 mol ethylene oxide, nonylphenol(meth)acrylate modified with 1-15 mol propylene oxide, di(meth)acrylates comprising 1-30 mol ethylene glycol chains, di(meth)acrylates comprising 1-30 mol propylene glycol chains, bisphenol A di(meth)acrylate modified with 1-30 mol ethylene oxide, bisphenol A di(meth)acrylate modified with 1-30 mol propylene oxide, bisphenol F di(meth)acrylate modified with 1-30 mol ethylene oxide, and bisphenol F di(meth)acrylate modified with 1-30 mol propylene oxide. These compounds may be used alone or in mixtures of two or more.

Preferred among these aromatic group-containing (meth)acrylate compounds, from the viewpoint of high refraction, are one or more compounds selected from the group consisting of phenoxyethyl acrylate, paraphenylphenoxyethyl acrylate and paraphenylphenyl acrylate. From the viewpoint of availability factors including cost and toxicity, it is preferred to use PEA, while for improved adhesiveness with boards it is preferred to use PGEA. It is more preferred to use both PEA and PGEA.

The amount of component (d) added is preferably 20-300 parts by weight and more preferably 50-250 parts by weight with respect to 100 parts by weight of the (a) polyorganosiloxane. Also, component (d) is preferably used at 25-100 parts by weight and more preferably 30-50 parts by weight with respect to 100 parts by weight of the (c) fluorene compound, from the viewpoint of further preventing shrinkage during curing and cracking under temperature shock. If the amount of component (d) added is at least 20 parts by weight with respect to 100 parts by weight of the (a) polyorganosiloxane and at least 25 parts by weight with respect to 100 parts by weight of the (c) fluorene compound, it will be possible to more effectively prevent shrinkage during curing and cracking by temperature shock. If the amount of addition is no greater than 300 parts by weight with respect to 100 parts by weight of the (a) polyorganosiloxane and no greater than 100 parts by weight with respect to 100 parts by weight of the (c)

fluorene compound, it will be possible for cured molded articles to more effectively exhibit a high refractive index, high permeability and high heat resistance.

(e) Compound Having 3 or More (Meth)acryloyl Groups in the Molecule

There may be further added to the photosensitive resin composition of the invention, a compound having 3 or more (meth)acryloyl groups in the molecule, in order to provide a photosensitive resin composition with superior properties for moldability. As examples of preferred compounds for addition there may be mentioned ditrimethylolpropane tetra(meth)acrylate, tetramethylolmethane tri(meth)acrylate, tetramethylolmethane tetra(meth)acrylate, dipentaerythritol penta(meth)acrylate, dipentaerythritol hexa(meth)acrylate, pentaerythritol tetra(meth)acrylate, pentaerythritol tri(meth)acrylate, trimethylolpropane tri(meth)acrylate, trimethylolpropane tri(meth)acrylate modified with 1-15 mol propylene oxide, trimethylolpropane tri(meth)acrylate modified with 1-20 mol ethylene oxide, pentaerythritol tetra(meth)acrylate modified with 1-20 mol ethylene oxide, glyceryl tri(meth)acrylate modified with 1-20 mol ethylene oxide, glyceryl tri(meth)acrylate modified with 1-20 mol propylene oxide, glycerol tri(meth)acrylate, ethylated pentaerythritol tri(meth)acrylate, dipentaerythritol hydroxypenta(meth)acrylate, dipentaerythritol penta(meth)acrylate modified with 1 mol alkyl, dipentaerythritol tetra(meth)acrylate modified with 2 mol alkyl, dipentaerythritol tri(meth)acrylate modified with 3 mol alkyl, and pentaerythritolethoxy tetra(meth)acrylate. These compounds may be used alone or in mixtures of two or more.

Of the (meth)acrylate compounds mentioned above, acrylate compounds are preferred from the viewpoint of curability, and ditrimethylolpropane tetraacrylate represented by the following formula (9):

[Chemical Formula 19]

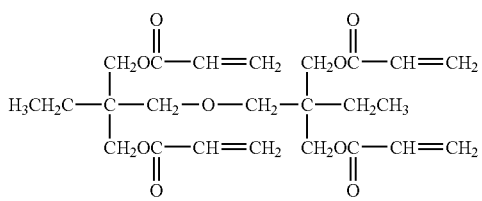

(9)

is especially preferred from the viewpoint of cost and toxicity. The amount of (meth)acrylate compound added is preferably 6-250 parts by weight and more preferably 20-100 parts by weight with respect to 100 parts by weight of the (a) polyorganosiloxane. If the amount added is at least 6 parts by weight, photoradical polymerization during light exposure will be accelerated and the surface curability will be improved, thereby yielding a practical cured molded article with superior properties for moldability. If the amount of addition is no greater than 250 parts by weight, the refractive index will not be significantly reduced and high refraction will be maintained, thus allowing a practical cured molded article without reduced weather resistance or heat resistance to be obtained.

(f) One or More Compounds Selected from the Group Consisting of Ultraviolet Absorbers and Hindered Amine-Containing Light Stabilizers There may be further added to the photosensitive resin composition of the invention, one or more compounds selected from the group consisting of ultraviolet absorbers and hindered amine-containing light stabilizers, in order to provide a photosensitive resin composition having an excellent property of light fastness for cured molded articles. As preferred compounds there may be mentioned ultraviolet absorbers represented by the following formula (10), the following formula (11) or the following formula (12), and hindered amine-containing light stabilizers represented by the following formula (13).

[Chemical Formula 20]

(10)

{In the formula, $R^{11}$ and $R^{12}$ are each independently C6-25 organic groups.}

In the ultraviolet absorbers represented by formula (10), $R^{11}$ and $R^{12}$ are C6-25 organic groups, but specifically they are preferably groups selected from among groups represented by the following structure.

[Chemical Formula 21]

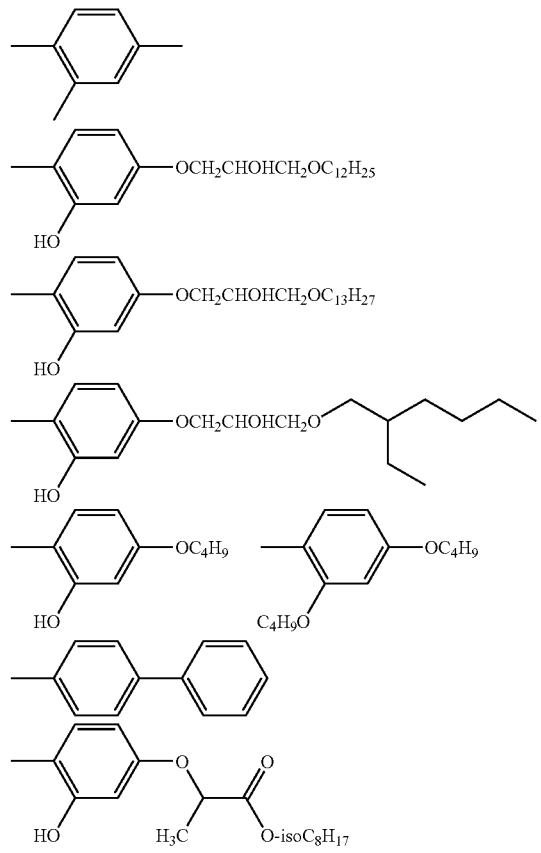

[Chemical Formula 22]

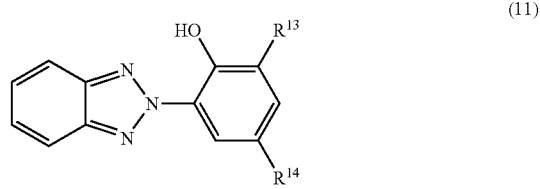

(11)

{In the formula, $R^{13}$ and $R^{14}$ are each independently C0-35 organic groups.}

[Chemical Formula 23]

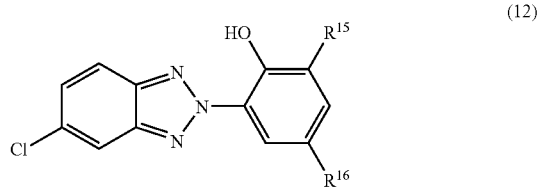
(12)

{In the formula, $R^{15}$ and $R^{16}$ are each independently C0-35 organic groups.}

In the ultraviolet absorbers represented by formula (11) or formula (12) above, $R^{13}$, $R^{14}$, $R^{15}$ and $R^{16}$ are each C0-35 organic groups, but specifically they are preferably groups selected from among groups represented by the following structure.

[Chemical Formula 24]

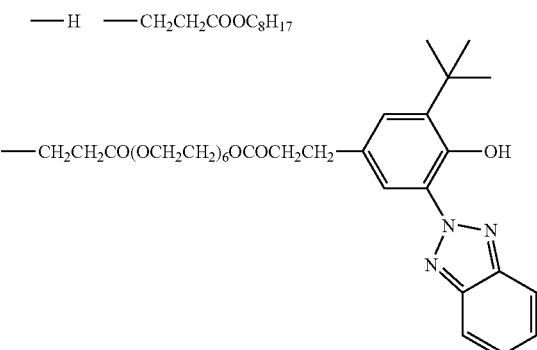

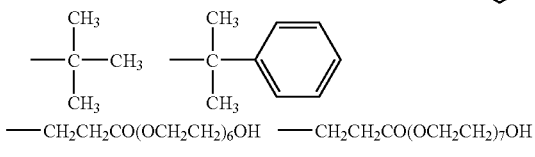

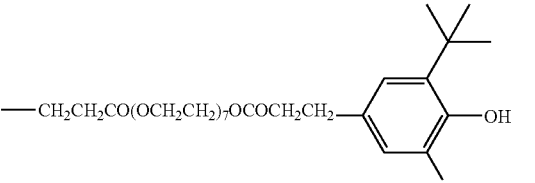

[Chemical Formula 25]

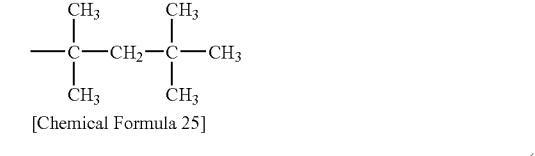

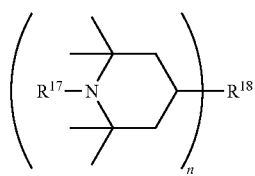
(13)

{In the formula, $R^{17}$ and $R^{18}$ are each independently C6-30 organic groups, and n is 1 or 2.}

In the hindered amine-containing light stabilizers represented by formula (13) above, $R^{17}$ and $R^{18}$ are C6-30 organic groups, but specifically they are preferably groups selected from among groups represented by the following structure.

[Chemical Formula 26]

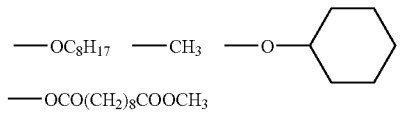

Also in the hindered amine-containing light stabilizers represented by formula (13) above, when n=2, $R^{18}$ is preferably a group selected from among groups represented by the following structure.

[Chemical Formula 27]

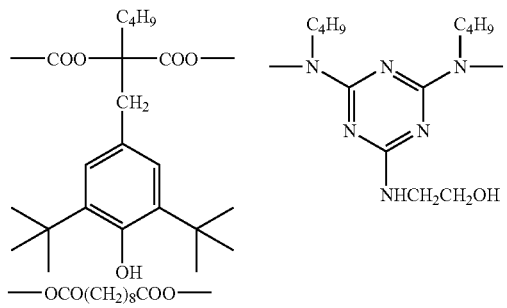

The ultraviolet absorber and hindered amine-containing light stabilizer in the photosensitive resin composition of the invention may be used alone, or in combinations of 2 or more.

As an ultraviolet absorber among those mentioned above that can maintain the initial high permeability of cured molded articles while exhibiting improving light fastness and weather resistance, there is particularly preferred 2-(2hydroxy-4-[1-octyloxycarbonylethoxy]phenyl)-4,6-bis(4-phenylphenyl)-1,3,5-triazine (TINUVIN479® by Ciba, Japan, hereunder also referred to as "TINUVIN479", compound represented by the following formula (14))

[Chemical Formula 28]

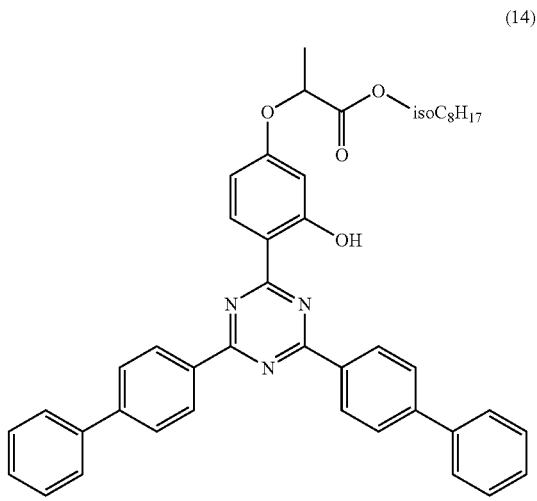
(14)

and as hindered amine-containing light stabilizers that can maintain high permeability after addition while improving light fastness and weather resistance there are particularly preferred 2,4-bis[N-butyl-N-(1-cyclohexyloxy-2,2,6,6-tetramethylpiperidin-4-yl)amino]-6-(2-hydroxyethylamine) (TINUVIN152® by Ciba, Japan, hereunder also referred to as "TINUVIN152", compound represented by the following formula (15))

[Chemical Formula 29]

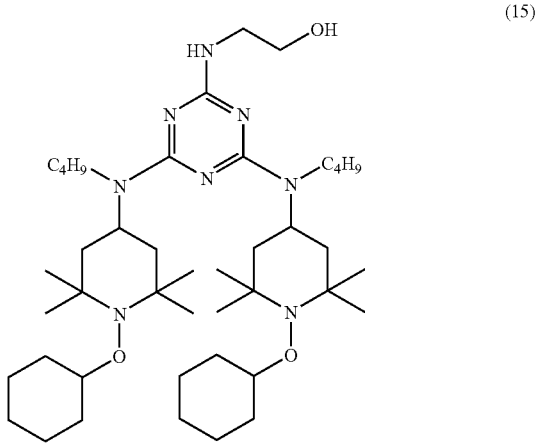

(15)

or a mixture of bis(1,2,2,6,6-pentamethyl-4-piperidino)sebacic acid and methyl(1,2,2,6,6-pentamethyl-4-piperidinyl)sebacic acid (TINUVIN292® by Ciba, Japan, hereunder also referred to as "TINUVIN292", compounds represented by the following formula (16) and the following formula (17))

[Chemical Formula 30]

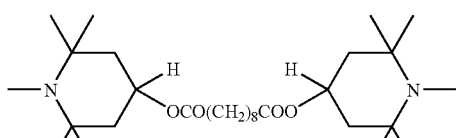

(16)

[Chemical Formula 31]

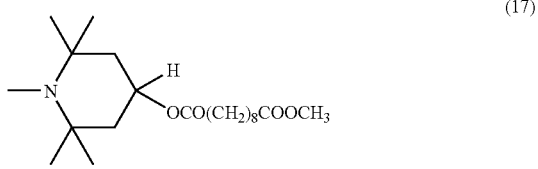

(17)

among which TINUVIN479 and combinations of TINUVIN152 and TINUVIN292 are more preferably used.

The amount of ultraviolet absorber or hindered amine-containing light stabilizer, when added, is preferably 0.2-50 parts by weight and more preferably 1-10 parts by weight with respect to 100 parts by weight of the (a) polyorganosiloxane. An addition amount of at least 0.2 part by weight is effective for improving the weather resistance and light fastness of cured molded articles. An addition amount of no greater than 50 parts by weight will allow the high permeability of the photosensitive resin composition and cured molded article to be maintained after addition, while improving the light fastness and weather resistance.

(g) One or More Compounds Selected from the Group Consisting of Silane Coupling Agents A silane coupling agent may be further added to the photosensitive resin composition of the invention to provide a photosensitive resin composition that retains high adhesiveness onto inorganic material boards such as glass and metal. As preferred silane coupling agents for addition there may be mentioned vinyltrichlorosilane, vinyltrimethoxysilane, vinyltriethoxysilane, 2-(3,4epoxycyclohexyl)ethyltrimethoxysilane, 3-glycidoxypropyltrimethoxysilane, 3-glycidoxypropylmethyldiethoxysilane, 3-glycidoxypropyltriethoxysilane, p-styryltrimethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, 3-acryloxypropyltrimethoxysilane, N-2(aminoethyl) 3-aminopropylmethyldimethoxysilane, N-2(aminoethyl) 3-aminopropyltrimethoxysilane, N-2(aminoethyl) 3-aminopropyltriethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, N-(vinylbenzyl)-2-aminoethyl-3-aminopropyltrimethoxysilane hydrochloride, 3-ureidopropyltriethoxysilane, 3-chloropropyltrimethoxysilane, 3-mercaptopropylmethyldimethoxysilane, 3-mercaptopropyltrimethoxysilane, bis(triethoxysilylpropyl)tetrasulfide, 3-isocyanatepropyltriethoxysilane, vinyltris(2-methoxyethoxy)silane, vinylmethyldimethoxysilane, 3-mercaptopropyltriethoxysilane, 3-octanoylthio-1-propyltriethoxysilane, 3-isocyanatepropyltrimethoxysilane, 3-triethoxysilyl-N-(1,3-dimethyl-butylidene), 3-acryloxypropyltrimethoxysilane, N-(p-vinylbenzyl)-N-(trimethoxysilylpropyl)ethylenediamine hydrochloride, 3-glycidoxypropylmethyldimethoxysilane, bis[3-(triethoxysilyl)propyl]disulfide, vinyltriacetoxysilane, vinyltriisopropoxysilane, allyltrimethoxysilane, diallyldimethylsilane, 3-mercaptopropyltriethoxysilane and N-(1,3-dimethylbutylidene)-3-aminopropyltriethoxysilane. These compounds may be used alone or in mixtures of two or more.

Of the silane coupling agents mentioned above there are particularly preferred 3-glycidoxypropyltrimethoxysilane (KBM-403 by Shin-Etsu Chemical Co., Ltd.), 3-methacryloxypropyltrimethoxysilane (KBM-503 by Shin-Etsu Chemical Co., Ltd.) and 3-aminopropyltriethoxysilane (KBE-903 by Shin-Etsu Chemical Co., Ltd.), from the viewpoint of cost and toxicity.

The amount of the (g) silane coupling agent, when it is added, is preferably 1-100 parts by weight and more preferably 10-50 parts by weight with respect to 100 parts by weight of the (a) polyorganosiloxane. An addition amount of at least 1 part by weight will allow a cured molded article to be obtained that has excellent adhesiveness for inorganic material boards such as glass and metal. If the amount of addition is no greater than 250 parts by weight, it will be possible to obtain a practical cured molded article that maintains high refraction and moldability.

(h) Solvent

A solvent may be added to the photosensitive resin composition of the invention to adjust the viscosity. As suitable solvents there may be mentioned N,N-dimethylformamide, N-methyl-2-pyrrolidone (hereunder also referred to as "NMP"), N-ethyl-2-pyrrolidone, tetrahydrofuran, N,N-dimethylacetamide (hereunder also referred to as "DMAc"), dimethyl sulfoxide, hexamethylphosphoramide, pyridine, cyclopentanone, γ-butyrolactone (hereunder also referred to as "GBL"), α-acetyl-γ-butyrolactone, tetramethylurea, 1,3-dimethyl-2-imidazolinone, N-cyclohexyl-2-pyrrolidone, propyleneglycol monomethyl ether, propyleneglycol monomethyl ether acetate, methyl ethyl ketone, methyl isobutyl ketone, anisole, ethyl acetate, ethyl lactate, butyl lactate and the like, any of which may be used alone or in combinations of two or more. Preferred among these are N-methyl-2-pyrrolidone and γ-butyrolactone, with propyleneglycol monomethyl ether acetate being especially preferred. These solvents may be appropriately added to the photosensitive resin composition depending on the coated film thickness and viscosity, but they are preferably used in the range of 0-200 parts by weight with respect to 100 parts by weight of the (a) polyorganosiloxane.

(i) Other Additives

A sensitizing agent may be added to the photosensitive resin composition of the invention for improved photosensitivity, as desired. As examples of such sensitizing agents there may be mentioned Michler's ketone, 4,4'-bis(diethylamino) benzophenone, 2,5-bis(4'-diethylaminobenzylidene)cyclopentanone, 2,6-bis(4'-diethylaminobenzylidene)cyclohexanone, 2,6-bis(4'-dimethylaminobenzylidene)-4-methylcyclohexanone, 2,6-bis(4'-diethylaminobenzylidene)-4-methylcyclohexanone, 4,4'-bis (dimethylamino)chalcone, 4,4'-bis(diethylamino)chalcone, 2-(4'-dimethylaminocinnamylidene)indanone, 2-(4'-dimethylaminobenzylidene)indanone, 2-(p-4'-dimethylaminobiphenyl)benzothiazole, 1,3-bis(4-dimethylaminobenzylidene)acetone, 1,3-bis(4-diethylaminobenzylidene) acetone, 3,3'-carbonyl-bis(7-diethylaminocoumarin), 3-acetyl-7-dimethylaminocoumarin, 3-ethoxycarbonyl-7-dimethylaminocoumarin, 3-benzyloxycarbonyl-7-dimethylaminocoumarin, 3-methoxycarbonyl-7-diethylaminocoumarin, 3-ethoxycarbonyl-7-diethylaminocoumarin, N-phenyl-N-ethylethanolamine, N-phenyldiethanolamine, N-p-tolyldiethanolamine, N-phenylethanolamine, N,N-bis (2-hydroxyethyl)aniline, 4-morpholinobenzophenone, 4-dimethylisoamyl aminobenzoate, 4-diethylisoamyl aminobenzoate, benztriazole, 2-mercaptobenzimidazole, 1-phenyl-5-mercapto-1,2,3,4-tetrazole, 1-cyclohexyl-5-mercapto-1,2,3,4-tetrazole, 1-(tert-butyl)-5-mercapto-1,2,3,4-tetrazole, 2-mercaptobenzothiazole, 2-(p-dimethylaminostyryl)benzoxazole, 2-(p-dimethylaminostyryl)benzthiazole, 2-(p-dimethylaminostyryl)naphtho(1,2-p)thiazole, 2-(p-dimethylaminobenzoyl)styrene and the like. These compounds may be used alone or in mixtures of two or more. The amount of sensitizing agent added will depend on the other additive components, but it is preferably 0-10 parts by weight and more preferably 1-5 parts by weight with respect to the (a) polyorganosiloxane.

A polymerization inhibitor may also be added to the photosensitive resin composition of the invention for improved viscosity during storage or photosensitivity stability, if desired. Examples of such polymerization inhibitors that may be used include hydroquinone, N-nitrosodiphenylamine, p-tert-butylcatechol, phenothiazine, N-phenylnaphthylamine, ethylenediaminetetraacetic acid, 1,2-cyclohexanediaminetetraacetic acid, glycol etherdiaminetetraacetic acid, 2,6-di-tert-butyl-p-methylphenol, 5-nitroso-8-hydroxyquinoline, 1-nitroso-2-naphthol, 2-nitroso-1-naphthol, 2-nitroso-5-(N-ethyl-N-sulfopropylamino)phenol, N-nitroso-N-phenylhydroxyamine ammonium salt, N-nitroso-N-phenylhydroxylamine ammonium salt, N-nitroso-N-(1-naphthyl)hydroxylamine ammonium salt and bis(4-hydroxy-3,5-ditert-butyl)phenylmethane. The amount of polymerization inhibitor added is preferably 0-5 parts by weight and more preferably 0.01-1 part by weight with respect to 100 parts by weight of the (a) polyorganosiloxane.

Various other additives may be added to the photosensitive resin composition of the invention as appropriate, including coating film smoothing agents and the like if necessary, so long as they do not interfere with the properties required of the photosensitive resin composition of the invention.

<Method for Producing Molded Article>

A method for producing a molded article using a photosensitive resin composition of the invention will now be described.

As examples of molded articles there may be mentioned microplastic lenses and optical elements for liquid crystal polarizing plates.

Microplastic lenses are minute plastic lenses usually with a diameter of no greater than several mm, and microlens arrays comprising an arrangement of a plurality of microlenses with diameters of about several tens of μm are used for improved light utilization efficiency in CCD imaging devices or LCD projectors, while microlens arrays with diameters of about several hundred μm are used in optical communication connectors or cellular phone camera modules.

An optical element for a liquid crystal polarizing plate is a structure on a polarized light filter (polarizing plate) as a liquid crystal projector or liquid crystal display member. Liquid crystal panels are generally provided with a pair of polarized light filters (polarizing plates) on the front and back of a transparent base with enclosed liquid crystals, and only polarized light of a given oscillating direction passes through. A liquid crystal polarizing plate can be fabricated by stretching a film or orientating a composition, but a material having the properties of a polarized light filter can also be produced by forming a specific structure with a pitch of 0.2-0.3 μm on a board.

A microplastic lens and an optical element for a liquid crystal polarizing plate differ only in their size and type, while their production methods are the same.

1) Step of filling molding die with photosensitive resin composition: A molding die is filled with the photosensitive resin composition through the opening of the molding die, or a solution comprising the photosensitive resin composition is coated onto one side of a board and the solvent dried off to form a thin-film of the photosensitive resin composition, and a die is pressed against the thin-film to fill the molding die with the photosensitive resin composition.

When the opening of the molding die is coated, a dropper or dispenser is used to drop the photosensitive resin composition into the opening of the molding die. For coating onto the side of a board, a dropper or dispenser is used for dropping, or coating is performed using a spin coater, bar coater, blade coater, curtain coater, screen printer or the like, or spray coating is performed with a spray coater or the like, to coat the board that has been pretreated as necessary, to form a film of the photosensitive resin composition.

The thickness of the photosensitive resin composition is preferably 0.01-10 mm, more preferably 0.05-1 mm and even more preferably 100-500 μm. For coating of the photosensitive resin composition, it may be diluted using a solvent such as NMP, in which case a step of removing the solvent by heating will be necessary. The heating may be carried out with the photosensitive resin composition thin-film formed side of the coated board facing upward, and the apparatus used may be any known apparatus for heating, such as an oven, a far-infrared ray oven or a hot plate. The heating conditions are preferably 50° C.-150° C. and preferably 100° C.-140° C., for 1-30 minutes and preferably 5-10 minutes. When the photosensitive resin composition has not been diluted with a solvent, a step of heating the entire board may be optionally added from the viewpoint of increasing the adhesiveness between glass boards and the photosensitive resin composition, in which case the apparatus used is preferably a hot plate.

Pretreatment of the board may involve coating the board with a silane coupling agent to impart adhesiveness for the board. When a silane coupling agent is coated, an organic solvent such as NMP is used for dilution, and the solvent used is removed by heating after coating using a spin coater, bar coater, blade coater, curtain coater or screen printer. The heating may be accomplished using a known apparatus such as an oven, far-infrared ray oven or hot plate. As chemical silane coupling agents there are preferred 3-glycidoxypropyltrimethoxysilane (KBM-403 by Shin-Etsu Chemical Co., Ltd.), 3-methacryloxypropyltrimethoxysilane (KBM-503 by Shin-Etsu Chemical Co., Ltd.) and 3-aminopropyltriethoxysilane (KBE-903 by Shin-Etsu Chemical Co., Ltd.), from the viewpoint of cost and toxicity.

The board used may be, for example, a glass board, a quartz board, a silicon board or a copper board such as a copper clad laminate. When the molding die is made of a material impermeable to light, a glass board or quartz board is preferred.

2) Step of pressing opening of molding die against board: The opening of the molding die, such as a microplastic lens die or liquid crystal polarizing plate optical element die, is pressed against the thin-film formed surface of the board. Extra pressure may also be applied if necessary. The material of the molding die may be rubber, glass, a plastic such as polydimethylsiloxane or a metal such as Ni, with polydimethylsiloxane being particularly preferred.

When a step of coating a silane coupling agent on the board is carried out before the step of pressing the opening of the die against the board, the opening of the die is pressed against the silane coupling agent-coated side of the board.

3) Light exposure step: With the photosensitive resin composition sandwiched between the board and molding die, ultraviolet rays are irradiated from the side of the material of the molding die or board that is permeable to the irradiated light. From the viewpoint of pattern resolution and manageability for the photocuring resin, the wavelength of the exposure light source is preferably i-ray wavelength and the apparatus is preferably a near-exposure type projection aligner. If necessary, a step of heating at 150° C.-260° C. for between 1 minute and 2 hours may be included.

4) Die releasing step: After ultraviolet curing, the molding die is released from the board.

5) Step of heating entire board (PEB treatment): The residual reactive groups are bonded by heating at a temperature of 150° C.-270° C. for 5 seconds-5 hours, to obtain a molded article with excellent heat resistance for a microplastic lens or liquid crystal polarizing plate optical element, for example. The heating may be carried out using a hot plate, an oven, or temperature-programmable oven that can be set with a temperature program. The atmosphere gas during heating may be air, but preferably an inert gas such as nitrogen or argon is used. The heating step is an optional step to increase the hardness of the molded article as a microplastic lens, liquid crystal polarizing plate optical element or the like.

Before the light exposure step of 3) above, a step of heating the entire board at 50-150° C. for between 1 and 30 minutes may be carried out with the opening of the die pressed against the board, or after the light exposure step of 3) above and before the die releasing step 4), a step of heating the entire board at 150° C.-260° C. for between 1 minute and 5 hours may be carried out.

<Method for Forming Cured Relief Pattern and Polyorganosiloxane Film>

An example of a method for forming a cured relief pattern using a photosensitive resin composition according to the invention will now be explained.

1) Step of coating photosensitive resin composition to obtain coated film: First, the photosensitive resin composition is coated onto a silicon wafer, a ceramic board, an aluminum sheet or another desired base material. The coating applicator or coating method used may be a spin coater, a die coater, a spray coater, dipping, printing, a blade coater, roll coating or the like. The coated base material is soft-baked at 80-200° C. for between 10 seconds and 1 hour.

2) Step of irradiating coated film with active light rays to photocure exposed sections: A light exposure projection apparatus such as a contact aligner, mirror projection or stepper is used for irradiation of active light rays through a desired photomask.

The active light rays may be X-rays, an electron beam, ultraviolet rays, visible light rays or the like, but light with a wavelength of 200-500 nm is preferred according to the invention. From the viewpoint of pattern resolution and manageability, the light source wavelength is most preferably UV-i rays (365 nm), and the light exposure projection apparatus is most preferably a stepper.

For improved photosensitivity, post-exposure baking (PEB) or pre-development baking may be carried out with any desired combination of temperature and time (preferably a temperature of 40° C.-200° C. and a time of between 10 seconds and 30 minutes), as necessary.

3) Step of removing uncured portions of film using developing solution: This step can be carried out by a dipping method, a paddle method or a rotating spray method. The developing solution used may be a good solvent for the photosensitive resin composition of the invention, either alone or as the good solvent in appropriate admixture with a poor solvent. As good solvents there may be mentioned N-methyl-2-pyrrolidone, N-acetyl-2-pyrrolidone, N,N-dimethylacetamide, N,N-dimethylformamide, dimethyl sulfoxide, γ-butyrolactone, α-acetyl-γ-butyrolactone, cyclopentanone, cyclohexanone, propyleneglycol monomethyl ether, propyleneglycol monomethyl ether acetate, methyl ethyl ketone and methyl isobutyl ketone, and as poor solvents there may be mentioned methanol, ethanol, isopropanol and water.

Upon completion of the development, rinsing is performed with a rinse solution to remove the developing solution, thus obtaining a relief patterned coating film. The rinse solution may be distilled water, methanol, ethanol, isopropanol, propyleneglycol monomethyl ether or the like, either alone or in appropriate mixtures, in which case they may be combined in a stepwise manner.

5) Step of heating entire base material ((final) heating step, PEB treatment): The relief pattern obtained in the manner described above is converted to a cured relief pattern at 150-260° C. The heat curing may be carried out using a hot plate, an inert oven, or a temperature-programmable oven that can be set with a temperature program. The atmosphere gas for heat curing may be air, or if necessary an inert gas such as nitrogen or argon may be used.

The obtained cured relief pattern may be used for purposes selected from the group consisting of surface protecting films, interlayer insulating films and α-ray-blocking films for semiconductor devices formed on base materials such as silicon wafers, supports (partitions) between microstructures such as microlens arrays, and package materials, or it may be applied in another step of a known semiconductor device production method to produce a semiconductor device comprising an optical element such as a CMOS image sensor. Electronic parts and semiconductor devices comprising coating films composed of resins obtained by curing the photosensitive resin composition can also be produced.

EXAMPLES

The present invention will now be explained in greater detail by the following synthesis examples and examples.

Synthesis Example 1

Synthesis of Polyorganosiloxane

In a 1 L round-bottomed flask there were charged 1.337 mol (289.3 g) of DPD (diphenylsilanediol) as a silanol compound, 1.337 mol (300.0 g) of p-styryltrimethoxysilane as an alkoxysilane compound and 0.003 mol (1.140 g) of tetratertiarybutoxytitanium as a catalyst, a cooler was mounted on the volumetric flask, and the reaction mixture was gradually heated in an oil bath from room temperature to 95° C. while stirring with a stirrer. After confirming reflux of methanol produced by condensation reaction, heating of the reaction mixture was continued for 1 hour at the same temperature. Upon completion of the reaction, the cooler was removed, the degree of vacuum was gradually increased to about 1-3 torr to avoid bumping, and vacuum pumping was continued while stirring at 70° C. while distilling off the generated methanol under reduced pressure to obtain a polyorganosiloxane (a-1).

Example 1

Preparation of Photosensitive Resin Composition

To 100 parts by weight of the (a-1) polyorganosiloxane synthesized in Synthesis Example 1 there were added 3.03 parts by weight of the compound IRGACURE127® (Ciba, Japan) of (8) above and 8.66 parts by weight of the compound DAROCUR TPO® (Ciba, Japan) of (7) above, as photopolymerization initiators (b). There were also added 196 parts by weight of A-BPEF (product of Shin-Nakamura Chemical Co., Ltd.) as component (c), 103 parts by weight of an aromatic group-containing acrylate compound PEA (light acrylate POA by Kyoeisha Chemical Co., Ltd.) and 21.6 parts by weight of PGEA (ARONIX 5700 by ToaGosei Co., Ltd.), as component (d). A mixture of all of the aforementioned compounds was stirred with a web rotor with heating at 70° C. until dissolution of each compound, to prepare a photosensitive resin composition (P-1).

Example 2

Method for Producing Microplastic Lens

1) Step of filling molding die with photosensitive resin composition: An appropriate amount of P-1 was dropped onto a non-alkaline glass board by Corning, Inc. (10 cm square, thickness: 0.7 mm).

2) Step of pressing opening of molding die against board: A microplastic lens die made of polydimethylsiloxane (hereunder also referred to as "PDMS") was pressed and fitted against with the P-1-dropped glass board, thus filling the openings of the microplastic lens die with P-1.

3) Light exposure step: With the photosensitive resin sandwiched between the glass board and microplastic lens die, a high-pressure mercury lamp (16 mW HMW-40-1, product of Orc Manufacturing Co., Ltd.) was used for irradiation of ultraviolet rays from the glass board side, without using a mask over any part of the surface. The exposure dose at i-ray wavelength (365 nm) was 1000 mJ/cm$^2$.

4) Die releasing step: After ultraviolet curing, the PDMS die was released from the glass board.

5) (Final) heating step (PEB treatment): A curing oven (CLH-21CD-S by Koyo Thermo System Co., Ltd.) was used for heating for 30 minutes under a nitrogen atmosphere at a temperature of 220° C.

Comparative Example 1

To 100 parts by weight of the (a-1) polyorganosiloxane synthesized in Synthesis Example 1 there were added 0.933 part by weight of IRGACURE127® and 2.67 parts by weight of DAROCUR TPO®, as photopolymerization initiators (b). Also, 29.7 parts by weight of PEA was added as component (d). A mixture of all of the aforementioned compounds was stirred with a web rotor with heating at 70° C. until dissolution, to prepare a photosensitive resin composition.

Comparative Example 2

To 100 parts by weight of the (a-1) polyorganosiloxane synthesized in Synthesis Example 1 there were added 1.40 parts by weight of the compound IRGACURE127® of (6) above and 4.00 parts by weight of the compound DAROCUR TPO® of (5) above, as photopolymerization initiators (b). Also, 94.6 parts by weight of A-BPEF was added as component (c). A mixture of all of the aforementioned compounds was stirred with a web rotor with heating at 70° C. until dissolution, to prepare a photosensitive resin composition.

Example 3

Preparation of Photosensitive Resin Composition

To 100 parts by weight of the (a-1) polyorganosiloxane synthesized in Synthesis Example 1 there were added 7.00 parts by weight of IRGACURE127® and 20.0 parts by weight of DAROCUR TPO®, as photopolymerization initiators (b). There were also added 600 parts by weight of A-BPEF as component (c), and 223 parts by weight of PEA and 50.0 parts by weight of PGEA as component (d). A mixture of all of the aforementioned compounds was stirred with a web rotor with heating at 70° C. until dissolution, to prepare a photosensitive resin composition.

Example 4

Preparation of Photosensitive Resin Composition

To 100 parts by weight of the (a-1) polyorganosiloxane synthesized in Synthesis Example 1 there were added 1.40 parts by weight of IRGACURE127® and 4.00 parts by weight of DAROCUR TPO®, as photopolymerization initiators (b). There were also added 40 parts by weight of A-BPEF as component (c), and 44.6 parts by weight of PEA and 10.0 parts by weight of PGEA as component (d). A mixture of all of the aforementioned compounds was stirred with a web rotor with heating at 70° C. until dissolution, to prepare a photosensitive resin composition.

Example 5

Preparation of Photosensitive Resin Composition

To 100 parts by weight of the (a-1) polyorganosiloxane synthesized in Synthesis Example 1 there were added 3.03 parts by weight of IRGACURE127® and 8.66 parts by weight of DAROCUR TPO®, as photopolymerization initiators (b). There were also added 161 parts by weight of A-BPEF as component (c) and 161 parts by weight of PEA as component (d) (100 parts by weight with respect to component (c)). A mixture of all of the aforementioned compounds was stirred with a web rotor with heating at 70° C. until dissolution, to prepare a photosensitive resin composition.

Example 6

Preparation of Photosensitive Resin Composition

To 100 parts by weight of the (a-1) polyorganosiloxane synthesized in Synthesis Example 1 there were added 3.56 parts by weight of IRGACURE127® and 10.2 parts by weight of DAROCUR TPO® as photopolymerization initiators (b), 207 parts by weight of A-BPEF as component (c), and 92.3 parts by weight of PEA and 95.9 parts by weight of bisphenol A diacrylate modified with 10 mol ethylene oxide, as component (d). A mixture of all of the aforementioned compounds was stirred with a web rotor with heating at 70° C. until dissolution, to prepare a photosensitive resin composition.

Example 7

Preparation of Photosensitive Resin Composition

To 100 parts by weight of the (a-1) polyorganosiloxane synthesized in Synthesis Example 1 there were added 3.03 parts by weight of IRGACURE127® and 8.66 parts by weight of DAROCUR TPO®, as photopolymerization initiators (b). There were also added 257 parts by weight of A-BPEF as component (c) and 64.2 parts by weight of PEA as component (d) (25 parts by weight with respect to component (c)). A mixture of all of the aforementioned compounds was stirred with a web rotor with heating at 70° C. until dissolution, to prepare a photosensitive resin composition.

Example 8

Preparation of Photosensitive Resin Composition

To 100 parts by weight of the (a-1) polyorganosiloxane synthesized in Synthesis Example 1 there were added 3.89 parts by weight of IRGACURE127® and 11.1 parts by weight of DAROCUR TPO® as photopolymerization initiators (b), 231 parts by weight of A-BPEF as component (c), 98.9 parts by weight of PEA and 27.8 parts by weight of PGEA as component (d), and 83.3 parts by weight of the ditrimethylolpropane tetraacrylate of (9) above (KARAYAD T1420(T)® by Nippon Kayaku Co., Ltd.) as component (e). A mixture of all of the aforementioned compounds was stirred with a web rotor with heating at 70° C. until dissolution, to prepare a photosensitive resin composition.

Example 9

Preparation of Photosensitive Resin Composition

To 100 parts by weight of the (a-1) polyorganosiloxane synthesized in Synthesis Example 1 there were added 3.04 parts by weight of IRGACURE127® and 8.70 parts by weight of DAROCUR TPO® as photopolymerization initiators (b), 196 parts by weight of A-BPEF as component (c), 103 parts by weight of PEA and 21.7 parts by weight of PGEA as component (d), and 0.435 part by weight of the compound TINUVIN479® (Ciba, Japan) of (14) above and 2.17 parts by weight of the compound TINUVIN152® (Ciba, Japan) of (15) above as component (f). A mixture of all of the aforementioned compounds was stirred with a web rotor with heating at 70° C. until dissolution, to prepare a photosensitive resin composition.

Example 10

Preparation of Photosensitive Resin Composition

To 100 parts by weight of the (a-1) polyorganosiloxane synthesized in Synthesis Example 1 there were added 3.03 parts by weight of IRGACURE127® and 8.66 parts by weight of DAROCUR TPO® as photopolymerization initiators (b), 196 parts by weight of A-BPEF as component (c), 103 parts by weight of PEA as component (d), and 21.7 parts by weight of KBM-503 (product of Shin-Etsu Chemical Co., Ltd.) as component (g). A mixture of all of the aforementioned compounds was stirred with a web rotor with heating at 70° C. until dissolution, to prepare a photosensitive resin composition.

[Evaluation of Cured Film Transparency: Measurement of Transmittance]

Five drops of each of the photosensitive resin compositions of Examples 1 and 3-10 and Comparative Examples 1 and 2 were dropped onto non-alkaline glass (thickness: 0.7 mm, size: 5 cm×10 cm, product of Corning, Inc.) using a dropper. After dropping the photosensitive resin composition, a polyethylene terephthalate film was spread over the non-alkaline glass, sandwiching the photosensitive resin composition between the non-alkaline glass and polyethylene terephthalate film for an anaerobic condition to allow curing inhibition by oxygen to be ignored. Next, a high-pressure mercury lamp (16 mW HMW-40-1 by Orc Manufacturing Co., Ltd.) was used for ultraviolet irradiation at a light quantity of 1000 mJ/cm$^2$ from the front side without a mask, and this was followed by 5) the (final) heating step (PEB) described in Example 2, to form a cured film with a thickness of 130 µm.

The transmittance of the cured film was measured using a UV3101PC by Shimadzu, with a slit width of 5.0 nm and a wavelength of 400 nm. The results are shown in Table 1 below. The cured films obtained from the photosensitive resin compositions of Examples 1 and 3-10 all had transmittances of 90% or greater, thus confirming that they maintained high transparency.

On the other hand, the cured films formed using the photosensitive resin compositions obtained in Comparative Examples 1 and 2 exhibited cracking by PEB treatment, and the transmittance could not be measured.

[Measurement of Refractive Indexes of Cured Films]

One drop of each of the photosensitive resin compositions of Examples 1 and 3-10 and Comparative Examples 1 and 2 were dropped onto non-alkaline glass (thickness: 0.7 mm, size: 5 cm×5 cm, product of Corning, Inc.) using a dropper. A polyethylene terephthalate film was spread over the non-alkaline glass, sandwiching the photosensitive resin composition between the non-alkaline glass and polyethylene terephthalate film, for anaerobic conditions to allow curing inhibition by oxygen to be ignored, after which a high-pressure mercury lamp (16 mW HMW-40-1 by Orc Manufacturing Co., Ltd.) was used for ultraviolet irradiation at a light quantity of 1000 mJ/cm$^2$ from the front side without a mask, and this was followed by 5) the (final) heating step (PEB) described in Example 2, to form a cured film with a thickness of 130 µm. The cured film was peeled from the non-alkaline glass board using the blade edge of a cutter, and a multiwavelength Abbe refractometer (DR-M2, product of Atago Co., Ltd.) was used to measure the refractive index at a wavelength of 589 nm. The measurement was conducted with the cured film sandwiched between a prism and lighting glass, and a monobromonaphthalene was dropped as an intermediate liquid at the interface with the prism and the interface with the lighting glass. The refractive indexes of the cured films formed using the photosensitive resins of Comparative Examples 1 and 2 before PEB were 1.589 and 1.610, respectively, but because cracking occurred with PEB treatment, the refractive index of the cured films after PEB treatment could not be measured.

As shown in Table 1, the refractive indexes of the cured films formed from the photosensitive resin compositions of Examples 1 and 3-10 all had values exceeding 1.58, thus confirming that high refractive indexes were maintained.

[Evaluation of Crack Resistance]

Five drops of each of the photosensitive resin compositions of Examples 1 and 3-10 and Comparative Examples 1 and 2 were dropped onto non-alkaline glass (thickness: 0.7 mm, size: 5 cm×10 cm, product of Corning, Inc.) using a dropper. After dropping the photosensitive resin composition, a polyethylene terephthalate film was spread over the non-alkaline glass, sandwiching the photosensitive resin composition between the non-alkaline glass and polyethylene terephthalate film for an anaerobic condition to allow curing inhibition by oxygen to be ignored. Next, a high-pressure mercury lamp (16 mW HMW-40-1 by Orc Manufacturing Co., Ltd.) was used for ultraviolet irradiation at a light quantity of 1000 mJ/cm$^2$ from the front side without a mask, and this was followed by 5) the (final) heating step (PEB) described in Example 2, to form a cured film with a thickness of 130 μm. The cured films were subjected to testing with a reflow tester (810-2-5Z by Koyo Thermo System Co., Ltd.) to compared the crack resistance. The reflow tester was used with the conveyor set to a driving speed of 200 mm/min, with 140° C. for step 1, 195° C. for step 2, 0° C. for step 3, 0° C. for step 4 and 390° C. for step 5, under a nitrogen atmosphere. The internal maximum temperature was 258° C. for 20 seconds. As a result of the reflow test, the cured films formed from the photosensitive resin compositions obtained in Example 1 and Examples 3-10 were confirmed to be free of cracks. On the other hand, the cured films formed using the photosensitive resin compositions obtained in Comparative Examples 1 and 2 exhibited cracking at the point of PEB treatment.

The transmittance of the cured film after the reflow test was measured using an UV3101PC by Shimadzu, with a slit width of 5.0 nm. The results are shown in Table 1. The cured films formed from the photosensitive resin compositions obtained in Examples 1, 3-8 and 10 all had transmittances of 90% or greater (the transmittance in Example 9 was 89%), thus confirming that high transparency was maintained even after the reflow test.

INDUSTRIAL APPLICABILITY

According to the invention it is possible to obtain a photosensitive transparent resin composition with a high refractive index as well as excellent crack resistance, that is useful as a material for integral products such as solid imaging devices and electronic parts which require a solder reflow step.

The invention claimed is:

1. A photosensitive resin composition comprising the following components (a) to (d): (a) 100 parts by weight of a polyorganosiloxane obtained by a method of combining at least one silanol compound represented by the following formula (1):

[Chemical Formula 1]

$$R^1{}_2Si(OH)_2 \quad (1)$$

{wherein the multiple $R^1$ groups each independently represent a C6-18 organic group containing at least one aromatic group), at least one alkoxysilane compound represented by the following formula (2):

[Chemical Formula 2]

$$R^2{}_aR^3{}_bSi(OR^4)_{4-a-b} \quad (2)$$

{wherein $R^2$ is a C2-17 organic group containing at least one group selected from the group consisting of epoxy and carbon-carbon double bond groups, when multiple $R^2$ groups are present they may be the same or different, $R^3$ and $R^4$ each independently represent methyl or ethyl, a is an integer of 1 or 2, b is an integer of 0 or 1, and a+b is no greater than 2} and a catalyst, and polymerizing them without active addition of water;

(b) 1-50 parts by weight of a photopolymerization initiator;
(c) 40-600 parts by weight of a fluorene compound represented by the following formula (3):

[Chemical Formula 3]

(3)

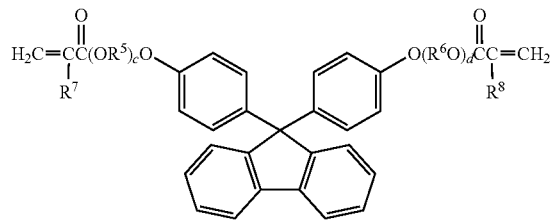

TABLE 1

| | | Example 1 | Example 3 | Example 4 | Example 5 | Example 6 | Example 7 | Example 8 | Example 9 | Example 10 | Comp. Ex. 1 | Comp. Ex. 2 |
|---|---|---|---|---|---|---|---|---|---|---|---|---|
| Crack resistance evaluation | After PEB | G | G | G | G | G | G | G | G | G | P | P |
| | After reflow test | G | G | G | G | G | G | G | G | G | — | — |
| Transmittance | Initial | 93 | 93 | 93 | 93 | 93 | 93 | 93 | 93 | 90 | — | — |
| | After reflow test | 94 | 94 | 94 | 94 | 94 | 94 | 94 | 89 | 91 | — | — |
| Refractive index | | 1.603 | 1.605 | 1.585 | 1.588 | 1.592 | 1.607 | 1.590 | 1.596 | 1.603 | — | — |

G: No cracking
P: Cracking

{wherein $R^5$ and $R^6$ each independently represent a C2-4 alkylene group, $R^7$ and $R^8$ each independently represent hydrogen or methyl, c and d are integers with c+d=0-24, and they may be the same or different, and the fluorene skeleton is optionally substituted with C1-28}; and (d) 20-300 parts by weight of a compound other than component (c), having one or two (meth)acryloyl groups in the molecule.

2. A photosensitive resin composition according to claim 1, wherein the (a) polyorganosiloxane is polymerized using diphenylsilanediol as the silanol compound represented by formula (1), and using a compound wherein a is 1 and b is 0 as the alkoxysilane compound represented by formula (2).

3. A photosensitive resin composition according to claim 1, wherein the (a) polyorganosiloxane is polymerized using at least one catalyst from among metal alkoxides represented by the following formula (4):

[Chemical Formula 4]

$$M^1(OR^9)_4 \quad (4)$$

{wherein $M^1$ is silicon, germanium, titanium or zirconium, and multiple $R^9$ groups are each independently C1-4 alkyl groups}, and metal alkoxides represented by the following formula (5):

[Chemical Formula 5]

$$M^2(OR^{10})_3 \quad (5)$$

{wherein $M^2$ is boron or aluminum, and multiple $R^{10}$ groups are each independently C1-4 alkyl groups}.

4. A photosensitive resin composition according to claim 1, wherein the (a) polyorganosiloxane is polymerized using a diphenylsilanediol as the silanol compound represented by formula (1), and using at least one compound selected from the group consisting of 3-methacryloxypropyltrimethoxysilane, 3-acryloxypropyltrimethoxysilane, vinylmethyltrimethoxysilane, vinylethyltrimethoxysilane, p-styryltrimethoxysilane and p-styryltriethoxysilane as the alkoxysilane compound represented by formula (2).

5. A photosensitive resin composition according to claim 1, wherein the (c) component is a fluorene compound represented by the following formula (6):

[Chemical Formula 6]

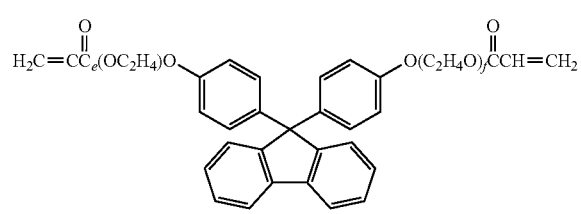

{wherein e and f each independently represent 1 or 2}.

6. A photosensitive resin composition according to claim 1, which comprises an aromatic group-containing (meth)acrylate compound as the (d) component.

7. A photosensitive resin composition according to claim 1, wherein the (d) component is at least one compound selected from the group consisting of phenoxyethyl acrylate, paraphenylphenoxyethyl acrylate and paraphenylphenyl acrylate.

8. A photosensitive resin composition according to claim 1, wherein the (b) photopolymerization initiator includes at least one compound selected from the group consisting of the compound represented by the following formula (7):

[Chemical Formula 7]

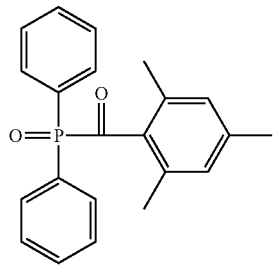

and the compound represented by the following formula (8):

[Chemical Formula 8]

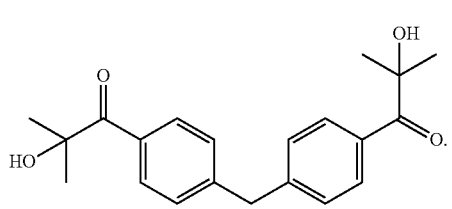

9. A photosensitive resin composition according to claim 1, which further comprises (e) 6-250 parts by weight of a compound having 3 or more (meth)acryloyl groups in the molecule.

10. A photosensitive resin composition according to claim 1, which further comprises (f) 0.2-50 parts by weight of one or more compounds selected from the group consisting of ultraviolet absorbers and hindered amine-containing light stabilizers.

11. A photosensitive resin composition according to claim 1, which further comprises (g) 1-100 parts by weight of a silane coupling agent.

12. A cured product obtainable by photocuring a photosensitive resin composition according to claim 1.

* * * * *